United States Patent [19]
Ganger et al.

[11] Patent Number: 4,750,078
[45] Date of Patent: Jun. 7, 1988

[54] SEMICONDUCTOR PROTECTION CIRCUIT HAVING BOTH POSITIVE AND NEGATIVE HIGH VOLTAGE PROTECTION

[75] Inventors: Jeffrey D. Ganger, Austin; Jeff D. Stump, Elgin, both of Tex.

[73] Assignee: Motorola, Inc., Schaumburg, Ill.

[21] Appl. No.: 61,502

[22] Filed: Jun. 15, 1987

[51] Int. Cl.⁴ ............................................. H02H 3/24
[52] U.S. Cl. ........................................ 361/56; 361/90; 361/86; 361/111; 357/23.13
[58] Field of Search ................... 361/56, 58, 90–91, 361/86, 100, 111, 18, 88, 54, 110; 323/276, 278, 299, 303; 357/23.13, 35, 13, 38, 39, 44

[56] References Cited

U.S. PATENT DOCUMENTS

| | | | |
|---|---|---|---|
| 4,302,791 | 11/1981 | Buchanan et al. | 361/86 |
| 4,484,244 | 11/1984 | Avery | 361/91 X |
| 4,633,283 | 12/1986 | Avery | 357/23.13 |
| 4,698,720 | 10/1987 | Finaurini | 361/91 |
| 4,704,654 | 11/1987 | Aberle et al. | 361/90 |

Primary Examiner—A. D. Pellinen
Assistant Examiner—Todd E. DeBoer
Attorney, Agent, or Firm—John A. Fisher; Jeffrey Van Myers; Robert L. King

[57] ABSTRACT

An input protection circuit is provided which prevents positive and negative voltages significantly higher than a supply voltage potential from damaging operational circuitry connected to an input terminal. A bipolar transistor has current conducting electrodes connected between the supply voltage and the input terminal. A first MOS transistor is coupled to the bipolar transistor for selectively eliminating a forward biased junction between the base and collector of the bipolar transistor in response to the sign and magnitude of an input signal. A second MOS transistor is coupled to the bipolar transistor for selectively eliminating a forward biased junction between the base and emitter of the bipolar transistor in responses to the sign and magnitude of the input signal.

7 Claims, 1 Drawing Sheet

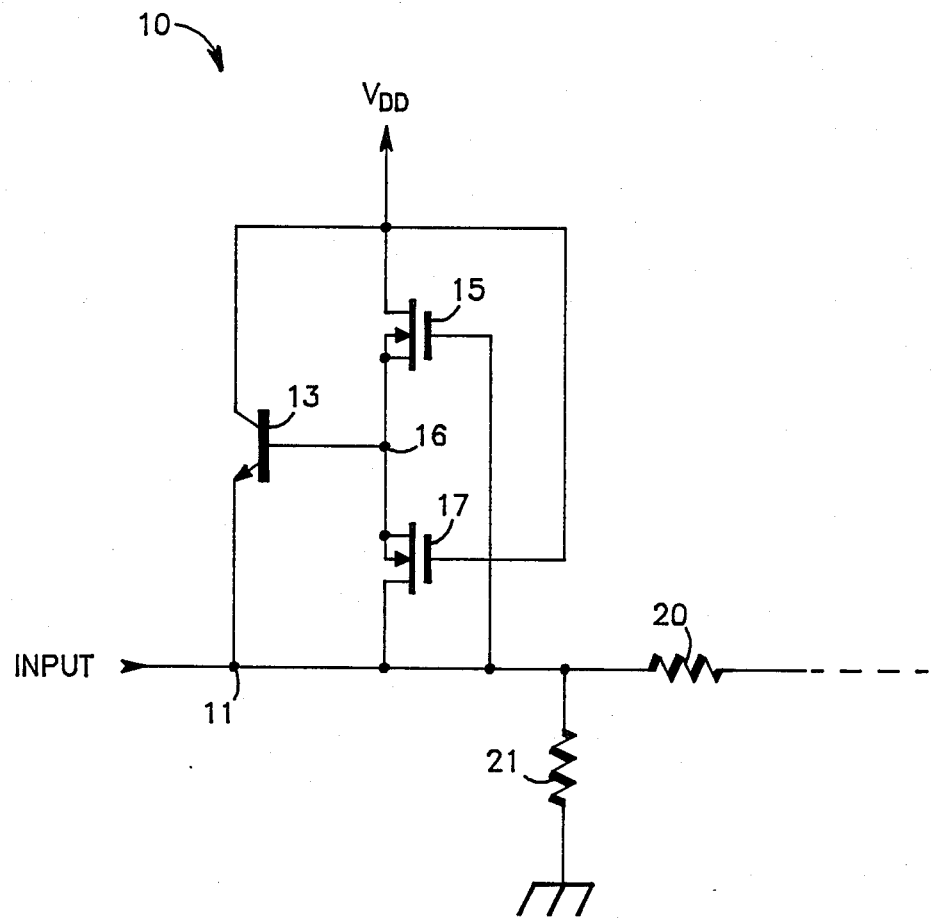

SEMICONDUCTOR PROTECTION CIRCUIT HAVING BOTH POSITIVE AND NEGATIVE HIGH VOLTAGE PROTECTION

TECHNICAL FIELD

This invention relates generally to input protection circuits, and more particularly, to input circuits for providing high voltage electrostatic discharge protection.

BACKGROUND ART

Input protection circuits are commonly used to prevent excessive input voltage levels such as electrostatic charges from destroying circuitry coupled to an input terminal. Many varieties of input protection devices exist. Some include a spark gap protection scheme wherein a metal strip which is separated by a gap of predetermined width is coupled between an input terminal and a ground reference. Whenever a large input voltage is coupled to the input, the excess voltage is allowed to conduct across the gap and be diverted to the ground reference and away from the circuitry. A metal plate for this type of protection has restrictive processing limitations and requires more circuit area than is often desired. Other input protection schemes typically utilize a pair of diodes which may shunt positive and negative voltages greater than a predetermined diode barrier breakdown voltage. A disadvantage with this type of input protection is the fact that such circuits typically do not allow larger operating voltages such as twenty-five to thirty volts to be coupled to the circuitry. In many applications, such as the telecom RS-232 standard, such operating voltages are used. Avery, in U.S. Pat. No. 4,400,711, teaches a protection device which permits input voltages exceeding a circuit's power supply voltage to be coupled to the circuit before input protection voltage shunting is utilized. The breakdown voltage which triggers the input protection in the Avery circuit is dependent on the threshold voltage of an MOS field effect transistor and is typically limited to a maximum value of about sixty volts.

BRIEF DESCRIPTION OF THE INVENTION

Accordingly, an object of the present invention is to provide an improved semiconductor protection circuit having both positive and negative high voltage protection.

Another object of this invention is to provide an improved input protection circuit.

Yet another object of the present invention is to provide an improved circuit for providing input voltage protection to an operating circuit while allowing input signals substantially larger than a supply voltage of the operating circuit to be coupled to the operating circuit.

In carrying out the above and other objects of the present invention, there is provided, in one form, a semiconductor protection circuit coupled to an input terminal of an operational circuit for preventing positive and negative voltages exceeding a predetermined magnitude from being coupled to the operational circuit. A bipolar transistor having first and second current conducting electrodes is coupled between a power supply voltage terminal and the input terminal. The bipolar transistor also has a control electrode. A first transistor is coupled between the first current conducting electrode and the control electrode of the bipolar transistor for selectively connecting the first current conducting electrode and the control electrode of the bipolar transistor in response to an input signal coupled to the input terminal. A second transistor is coupled between the input terminal and the control electrode of the bipolar transistor. The second transistor selectively connects the control electrode and the second current electrode of the bipolar transistor in response to the input signal.

These and other objects, features and advantages will be more clearly understood from the following detailed description taken in conjunction with the accompanying drawing.

BRIEF DESCRIPTION OF THE DRAWING

The single Figure illustrates in schematic diagram form a protection circuit in accordance with the present invention.

DETAILED DESCRIPTION OF THE INVENTION

Shown in the single Figure is an input protection circuit 10 for preventing excessively large magnitude voltages from damaging operating circuitry not shown. An input terminal 11 receives an input signal labeled "INPUT" having a varying voltage level. An NPN bipolar transistor 13 has a collector connected to a power supply voltage terminal for receiving a positive power supply voltage labeled "$V_{DD}$". An emitter of bipolar transistor 13 is connected to input terminal 11. An N-channel MOS field effect transistor 15 has a drain connected to power supply voltage $V_{DD}$. A gate of transistor 15 is connected to input terminal 11, and a source of transistor 15 is connected to a base of bipolar transistor 13 at a node 16. An N-channel MOS field effect transistor 17 has a drain connected to node 16, a gate connected to power supply voltage $V_{DD}$, and a source connected to input terminal 11. A polysilicon resistor 20 has a first terminal connected to input terminal 11. A second terminal of polysilicon resistor 20 is coupled to operating circuitry not shown as illustrated by the dashed line. A first terminal of a polysilicon resistor 21 is connected to input terminal 11, and a second terminal of resistor 21 is connected to a reference ground terminal.

In operation, bipolar transistor 13 is utilized as a primary source of input high voltage protection to protect circuitry connected to input terminal 11 such as polysilicon resistors 20 and 21 from high voltage levels. Polysilicaon resistors 20 and 21 may themselves be utilized as current limiting devices and have an input protection function. However, polysilicon resistors 20 and 21 are also susceptible to high voltage damage. Since a bipolar transistor typically has a higher breakdown voltage than an MOS transistor, bipolar transistor 13 is used in protection circuit 10. In an open base configuration, a bipolar transistor typically has a reverse bias breakdown voltage in the range of eighteen to twenty-four volts and has a forward bias breakdown voltage in the range of thirty to sixty volts. However, the breakdown voltage of a bipolar transistor significantly increases when the bipolar transistor is configured as a zener diode. For example, the breakdown voltage of a bipolar transistor in a shorted base-emitter configuration is between one hundred to one hundred fifty volts and the breakdown voltage of a bipolar transistor in a shorted basecollector configuration varies between approximately twenty-eight and thirty-five volts. The present invention takes advantage of these higher breakdown voltage potentials to provide high input voltage protection for circuitry such as polysilicon resistors 20 and 21. In a reverse bias junction, the only charge carriers which can pass thru the junction are minority carriers. In a single P/N junction such as a diode, the only current conducted in a reverse bias condition is leakage current which is the normal temperature dependent combination/recombination of electron hole pairs which creates the minority carriers. An avalanche condition is strongly dependent on the number of minority carriers because minority carriers collide with the crystal lattice structure of the junction. In a forward bias junction, the carrier which passes thru the junction is a majority carrier. Therefore, a forward bias junction significantly multiplies the number of minority carriers as compared to a reverse bias junction and drastically reduces the avalanche voltage.

Electrostatic inputs which may be coupled to input terminal 11 may be either a large positive or a large negative potential with respect to reference ground. Assume initially that no large voltages are coupled to input terminal 11. Assuming either no voltage or a voltage less than $V_{DD}$ is coupled to input terminal 11, neither transistor 15 nor transistor 17 is conductive. Therefore, bipolar transistor 13 is connected between supply voltage $V_{DD}$ and input terminal 11 in an open base configuration during normal voltage range operation. However, should the voltage potential at input terminal 11 suddenly rise well above $V_{DD}$, transistor 15 is made conductive at a predetermined bias voltage above $V_{DD}$. In a preferred form, both transistors 15 and 17 are fabricated as wide gate oxide transistors. Transistor 15 typically may not become conductive until the input voltage potential at input terminal 11 is somewhere between ten and fifteen volts above $V_{DD}$. Once transistor 15 is conductive, bipolar transistor 13 is diode configured to provide a forward biased Zener diode between input terminal 11 and supply voltage $V_{DD}$. Therefore, the positive high voltage is shunted thru the power supply to ground rather than thru polysilicon resistors 20 and 21. Whenever the voltage at input terminal 11 begins to decrease in magnitude and returns to several volts above $V_{DD}$, transistor 15 will again become nonconductive. Bipolar transistor 13 again provides input protection in an open base configuration and continues to shunt any excess voltage to ground thru the $V_{DD}$ power supply. When conductive, transistor 15 functions to remove the forward biased base to collector junction of bipolar transistor for high voltage input signals which significantly exceed supply voltage $V_{DD}$. As previously mentioned, by removing a forward biased junction of bipolar transistor 13, the breakdown voltage may significantly be increased.

Similarly assume that a large negative voltage with respect to ground is coupled to input terminal 11. For small input voltage signals and all negative input voltages, transistor 15 is nonconductive. As the voltage potential at the source of transistor 17 approaches ground potential and is made negative, transistor 17 becomes strongly conductive. Since the gate of transistor 17 is connected to supply voltage $V_{DD}$, a threshold voltage differential at the source of transistor 17 is readily realized as the input voltage at input terminal 11 decreases. For lower voltage inputs, transistor 15 is made nonconductive and is virtually removed from circuit 10. Transistor 17 makes bipolar transistor 13 diode configured with the base electrically shorted to the emitter. Transistor 17 does not have to be a physically large transistor to be able to effectively short the base and emitter of as transistor 13 and only needs to conduct a small amount of leakage current thru the collector/base junction of bipolar transistor 13. In the diode configuration, the reverse bias breakdown voltage of bipolar transistor 13 between the emitter and collector of transistor 13 is increased to the range between one hundred and one hundred fifty volts. Therefore, a signifcant increase in the breakdown voltage afforded by bipolar transistor 13 has been realized. As transistor 15 functioned in the high positive input voltage operating condition, transistor 17 functions to eliminate the forward bias junction between the base and emitter of bipolar transistor 13 under high negative input voltage operating conditions. The net effect is to significantly increase the breakdown voltage protection provided by bipolar transistor 13 to a range substantially above or below the magnitude of the power supply voltage.

By now it should be apparent that an input protection circuit for protecting circuitry from high voltages significantly greater in magnitude than a supply voltage potential has been provided The present invention provides significant high voltage protection without substantially increasing circuit size in an input voltage protection application. The present invention provides high voltage input protection initially thru bipolar transistor 13. For significantly high positive and negative voltages, transistors 15 and 17 assist bipolar transistor 13 and function to provide input protection for a significantly higher magnitude of input signal. Since input protection is not automatically triggered at a low threshold value, more flexibility is afforded for coupling varying voltages to operational circuits was previously provided by some known protection circuits.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

We claim:

1. A semiconductor protection circuit coupled to an input terminal of an operational circuit for preventing positive and negative voltages exceeding a predetermined magnitude from being coupled to the operational circuit, comprising:

bipolar transistor means having first and second current conducting electrodes coupled between a power supply voltage terminal and the input terminal, and a control electrode;

first means coupled between the first current conducting electrode and the control electrode of the bipolar transistor means and selectively connecting the first current conducting electrode and the control electrode of the bipolar transistor means in response to an input signal coupled to the input terminal; and second means coupled between the input terminal and the control electrode of the bipolar transistor means and selectively connecting the control electrode and the second current electrode of the bipolar transistor means in response to the input signal are each an MOS transistor.

2. The semiconductor protection circuit of claim 1 wherein the first current conducting electrode of the bipolar transistor means is a collector and the second current conducting electrode of the bipolar transistor means is an emitter.

3. A semiconductor protection circuit for protecting an operational circuit from both positive and negative voltages having a magnitude greater than a predetermined voltages, comprising:
   a bipolar transistor having an emitter electrode coupled to an input terminal for receiving an input signal, a base electrode, and a collector electrode coupled to a power supply terminal;
   a first MOS transistor having a first current electrode coupled to the power supply terminal, a control electrode coupled to said input terminal, and a second current electrode coupled to the base electrode of the bipolar transistor; and
   a second MOS transistor having a first current electrode coupled to the base electrode of the coupled to said power supply terminal, and a second current electrode coupled to said input terminal.

4. The semiconductor protection circuit of claim 3 wherein the power supply terminal is adapted to receive a positive power supply voltage, and the first and second MOS transistors are N-channel conductivity type transistors.

5. The semiconductor protection circuit of claim 3 wherein the first current electrode of the first MOS transistor is a drain, the second current electrode of the first MOS transistor is a source, the first current electrode of the second MOS transistor is a drain, and the second current electrode of the second MOS transistor is a source.

6. An input protection circuit comprising:
   an NPN bipolar transistor having an emitter coupled to an input terminal, a base, and a collector coupled to a power supply terminal;
   a first N-channel MOS transistor having a drain coupled to said power supply terminal, a gate coupled to said input terminal, and a source connected to the base of the bipolar transistor; and
   a second N-channel MOS transistor having a drain coupled to the base of the bipolar transistor, a gate coupled to said power supply terminal, and a source coupled to said input terminal.

7. The input protection circuit of claim 6 wherein said power supply terminal is adapted to receive a positive supply voltage relative to a ground reference potential.

* * * * *

UNITED STATES PATENT AND TRADEMARK OFFICE
CERTIFICATE OF CORRECTION

PATENT NO. : 4,750,078
DATED : June 7, 1988
INVENTOR(S) : Jeffrey D. Ganger et al.

It is certified that error appears in the above-identified patent and that said Letters Patent is hereby corrected as shown below:

In claim one, column 4, line 64, after "signal" insert --,wherein the first and second means--.

In claim three, column 5, at line 7, change "voltages" to --voltage-- and at line 19 after the second occurrence of "the", insert --bipolar transistor, a control electrode--.

Signed and Sealed this

Twenty-fourth Day of July, 1990

*Attest:*

HARRY F. MANBECK, JR.

*Attesting Officer*  *Commissioner of Patents and Trademarks*